United States Patent
Eriksen et al.

(10) Patent No.: US 9,016,314 B2
(45) Date of Patent: Apr. 28, 2015

(54) FLUID CONNECTOR FOR A COOLING SYSTEM

(71) Applicants: Andre Sloth Eriksen, Morgan Hill, CA (US); Mikael Krog, Bronderslev (DK); Jan Hunskjaer, Svenstrup (DK)

(72) Inventors: Andre Sloth Eriksen, Morgan Hill, CA (US); Mikael Krog, Bronderslev (DK); Jan Hunskjaer, Svenstrup (DK)

(73) Assignee: Asatek Danmark A/S, Aalborg East (DK)

( * ) Notice: Subject to any disclaimer, the term of this patent is extended or adjusted under 35 U.S.C. 154(b) by 36 days.

(21) Appl. No.: 13/832,593

(22) Filed: Mar. 15, 2013

(65) Prior Publication Data

US 2013/0312854 A1 Nov. 28, 2013

Related U.S. Application Data

(63) Continuation-in-part of application No. 13/481,210, filed on May 25, 2012.

(51) Int. Cl.
*F16L 37/32* (2006.01)
*F28F 19/00* (2006.01)

(52) U.S. Cl.
CPC *F28F 19/00* (2013.01); *F16L 37/32* (2013.01)

(58) Field of Classification Search
USPC ............. 137/614.01–614.06; 251/149.1, 251/149.6–149.8; 285/315, 316
See application file for complete search history.

(56) References Cited

U.S. PATENT DOCUMENTS

| | | | | |
|---|---|---|---|---|
| 979,481 | A | * | 12/1910 | Hannold ................. 210/445 |
| 2,320,456 | A | * | 6/1943 | Frazer-Nash ............ 251/149.6 |
| 4,590,962 | A | * | 5/1986 | Tespa .................... 137/550 |
| 4,607,670 | A | | 8/1986 | Compton et al. |
| 5,191,914 | A | * | 3/1993 | Gonzalez ............. 137/614.03 |
| 5,330,155 | A | * | 7/1994 | Lechner ................ 251/149.6 |
| 5,492,143 | A | * | 2/1996 | Cooper et al. ............ 137/550 |
| 5,509,468 | A | | 4/1996 | Lopez |
| 5,628,344 | A | | 5/1997 | Roberts |
| 5,904,302 | A | | 5/1999 | Brown |
| 5,951,728 | A | * | 9/1999 | Hopson ................. 137/545 |
| 6,024,124 | A | | 2/2000 | Braun et al. |
| 6,161,578 | A | | 12/2000 | Braun et al. |
| 7,097,765 | B1 | * | 8/2006 | Jackiw et al. ............ 210/282 |

(Continued)

FOREIGN PATENT DOCUMENTS

DE 202005001101 4/2005
EP 0697232 2/1996

(Continued)

OTHER PUBLICATIONS

Colder Products Company, Products Catalog, 134 pages (2011).

(Continued)

*Primary Examiner* — Craig Schneider
*Assistant Examiner* — Craig J Price
(74) *Attorney, Agent, or Firm* — Finnegan, Henderson, Farabow, Garrett & Dunner, LLP

(57) ABSTRACT

Embodiments of the disclosure may include a fluid connector. The fluid connector may include a holding portion including a housing defining a channel, a sleeve disposed in the channel and defining a passage, an adapter disposed in the passage of the sleeve, and a filter configured to prevent the flow of contaminants into the channel of the housing. The fluid connector may also include an insert portion configured to be inserted into the channel of the housing and secured to the holding portion.

9 Claims, 12 Drawing Sheets

(56) References Cited

U.S. PATENT DOCUMENTS

| | | | |
|---|---|---|---|
| 7,185,674 B2 * | 3/2007 | Taylor | 251/149.6 |
| 7,469,472 B2 | 12/2008 | deCler et al. | |
| 7,547,047 B2 | 6/2009 | deCler et al. | |
| 7,708,029 B2 | 5/2010 | Kitagawa et al. | |
| D639,398 S | 6/2011 | Wilhelm | |
| D642,244 S | 7/2011 | Wilhelm | |
| 8,196,606 B2 | 6/2012 | Kitagawa | |
| 8,443,837 B2 | 5/2013 | Kimura | |
| 2002/0148514 A1 * | 10/2002 | Taneya et al. | 137/614.03 |
| 2005/0001425 A1 | 1/2005 | deCler et al. | |
| 2006/0021660 A1 * | 2/2006 | Taylor | 137/540 |
| 2006/0138704 A1 | 6/2006 | deCler et al. | |
| 2007/0025811 A1 | 2/2007 | Wilhelm | |

FOREIGN PATENT DOCUMENTS

| | | |
|---|---|---|
| FR | 2711764 | 5/1995 |
| JP | 3452059 B1 | 9/2003 |

OTHER PUBLICATIONS

PCT International Search Report and PCT Written Opinion of the International Authority for corresponding PCT Application No. PCT/IB2013/001424, mailed Oct. 17, 2013, (11 pages total).

PCT International Search Report and PCT Written Opinion of the International Searchtng Authority for corresponding PCT application PCT/IB2013/001439, mailed Oct. 17, 2013, (9 pages total).

* cited by examiner

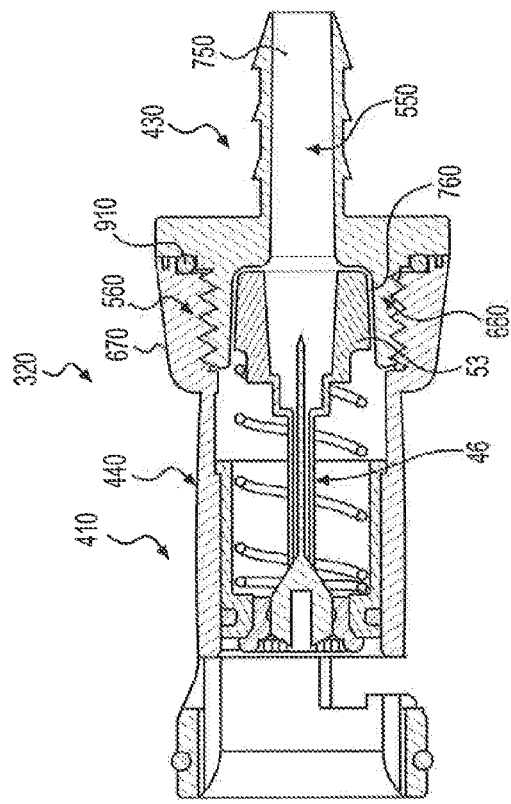
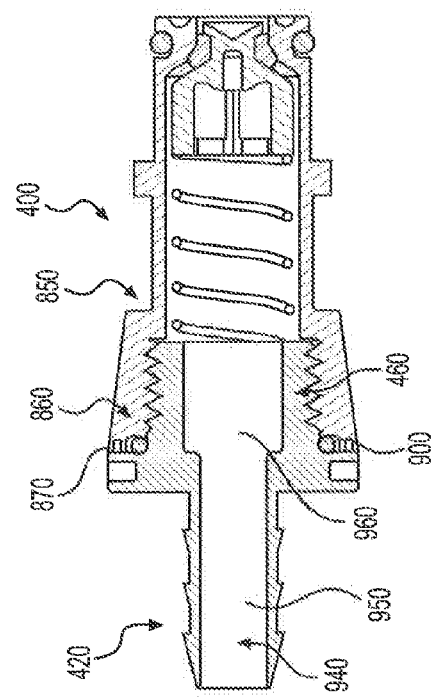
FIG. 12
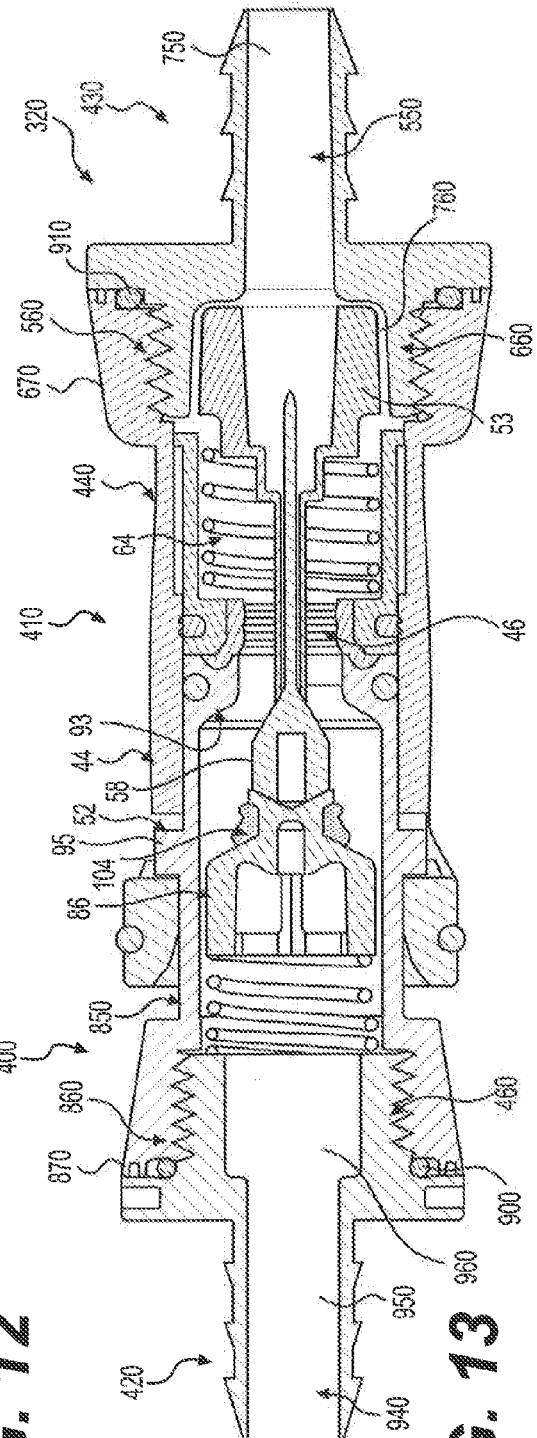
FIG. 13

FLUID CONNECTOR FOR A COOLING SYSTEM

CROSS-REFERENCE TO RELATED APPLICATION

This application is a continuation-in-part of U.S. application Ser. No. 13/481,210, filed May 25, 2012, which is incorporated herein by reference in its entirety.

TECHNICAL FIELD

The present disclosure is related generally to fluid connectors for systems of cooling heat generating components of a computer server or other systems that operate in an enclosed data processing environment.

BACKGROUND

Electronic systems, such as, for example, computer systems include several integrated circuit (IC) devices that generate heat during operation. For effective operation of the computer system, the temperature of the IC devices have to be maintained within acceptable limits. While the problem of heat removal from IC devices is an old one, this problem has increased in recent years due to greater numbers of transistors that are packed into a single IC device while reducing the physical size of the device. Increasing number of transistors compacted into a smaller area results in a greater concentration of heat that must be removed from that smaller area. Bundling multiple computer systems together, such as, for example, in a server, further aggravates the heat removal problem by increasing the amount of heat that has to be removed from a relatively small area.

In a typical computer server ("server"), multiple computer server modules ("modules") are stacked together in a rack or a case to consolidate network resources and minimize floor space. Modules which are designed for use in a server configuration are typically characterized by a motherboard comprising heat generating electronic components (such as IC devices) housed in a modular chassis or case, which in turn is mounted together with other similar modules, in a rack, blade cabinet, blade server, or other support structure. In practice, multiple servers (each comprising several modules) are typically located in an enclosed space such as a server room or a data center. During operation, the electronic components in the individual modules generate heat which must be removed for effective functioning of the server. FIG. 1 illustrates an prior art method used to cool multiple servers (each containing multiple modules) housed in an enclosed environment such as, for example, a server room. In such a prior art system, cooling fans are used circulate ambient air from the server room through the multiple modules of a server to absorb heat therefrom. In the prior art system, cool air directed into the server room through a cold air plenum is passed through the servers to absorb heat generated by IC devices and other heat generating components therein. After absorbing the generated heat, the heated air is exhausted back into the server room. This heated air is directed through a warm air plenum to a computer room air conditioning (CRAC) system to cool the air and recirculate it back to the server room through the cold air plenum.

It is known that a large portion (greater than about 31%) of the energy consumption of a typical server room is used in the operation of the CRAC system, and that significant energy savings and resultant green house gas reduction can be achieved by improving the efficiency of the CRAC system. "Data Center Energy Characterization Study Site Report," February 2001, available at http://hightech.lbl.gov/documents/DATA CENTERS/DC Benchmarking/Data Center Facili ty1.pdf; "Energy Consumption of Information Technology Data Centers," and references cited therein, Iyengar et al., December 2010, available at http://www.electronics-cooling.com/2010/12/energy-consumption-of-information-technology-data-centers/. Improving the cooling efficiency of servers housed in a server room thereby enables more efficient utilization and conservation of available energy resources, and green house gas emission reduction.

The disclosed cooling systems and methods are directed to an energy efficient approach of cooling one or more servers located in an enclosed environment, such as a server room, and include fluid connectors for connecting and disconnecting fluid conduits of the cooling systems.

SUMMARY OF THE DISCLOSURE

In one aspect of the disclosure a fluid connector may include a holding portion including a housing defining a channel, a sleeve disposed in the channel and defining a passage, an adapter disposed in the passage of the sleeve, and a filter configured to prevent the flow of contaminants into the channel of the housing. The fluid connector may also include an insert portion configured to be inserted into the channel of the housing and secured to the holding portion.

In another aspect of the disclosure, a fluid connector may include an insert portion including a first housing defining a first channel, an insert valve disposed in and configured to move relative to the first channel, and a first filter configured to prevent the flow of contaminants into the first channel of the first housing. The fluid connector may also include a holding portion including a second housing defining a second channel, wherein the insert portion is configured to be inserted into the second channel and secured to the holding portion.

In yet another aspect of the disclosure, a fluid connector may include an insert portion including a first housing defining a first channel, an insert valve disposed in and configured to move relative to the first channel, and a first filter configured to prevent the flow of contaminants into the first channel of the first housing. The fluid connector may also include a holding portion including a second housing defining a second channel, a sleeve disposed in the second channel and defining a passage, an adapter disposed in the passage of the sleeve, a second filter configured to prevent the flow of contaminants into the second channel of the second housing, and wherein the insert portion is configured to be inserted into the second channel and secured to the holding portion.

BRIEF DESCRIPTION OF THE DRAWINGS

FIG. 5 illustrates a cross-sectional view of a holding portion of the fluid connector of FIG. 3A, according to an exemplary disclosed embodiment;

FIG. 6 illustrates an enlarged cross-sectional view of the holding portion of FIG. 5, according to an exemplary disclosed embodiment;

FIG. 12 illustrates a cross-sectional view of the fluid connector of FIG. 11A in a disengaged configuration, according to an exemplary disclosed embodiment;

FIG. 13 illustrates a cross-sectional view of the fluid connector of FIG. 11A in an engaged configuration, according to an exemplary disclosed embodiment;

DETAILED DESCRIPTION

The following detailed description illustrates a cooling system and fluid connectors for the cooling system by way of example and not by way of limitation. Although the description below describes an application of a cooling system to servers housed in an enclosed environment, embodiments of the disclosed cooling systems may be applied to cool heat generating components in any application. For example, embodiments of the current disclosure may be used to cool portable computers that operate while being docked to a docking station. The description enables one of ordinary skill in the art to make and use the present disclosure for cooling any electronic component within a console or a chassis.

Reference will now be made to exemplary embodiments of the disclosure, examples of which are illustrated in the accompanying drawings. Wherever possible, the same reference numbers will be used throughout the drawings to refer to the same or like parts. Elements or parts designated using the same reference numbers in different figures perform similar functions. Therefore, for the sake of brevity, these elements may not be described with reference to every figure. In the description that follows, if an element is not described with reference to a figure, the description of the element made with reference to another figure applies.

Figure 1:
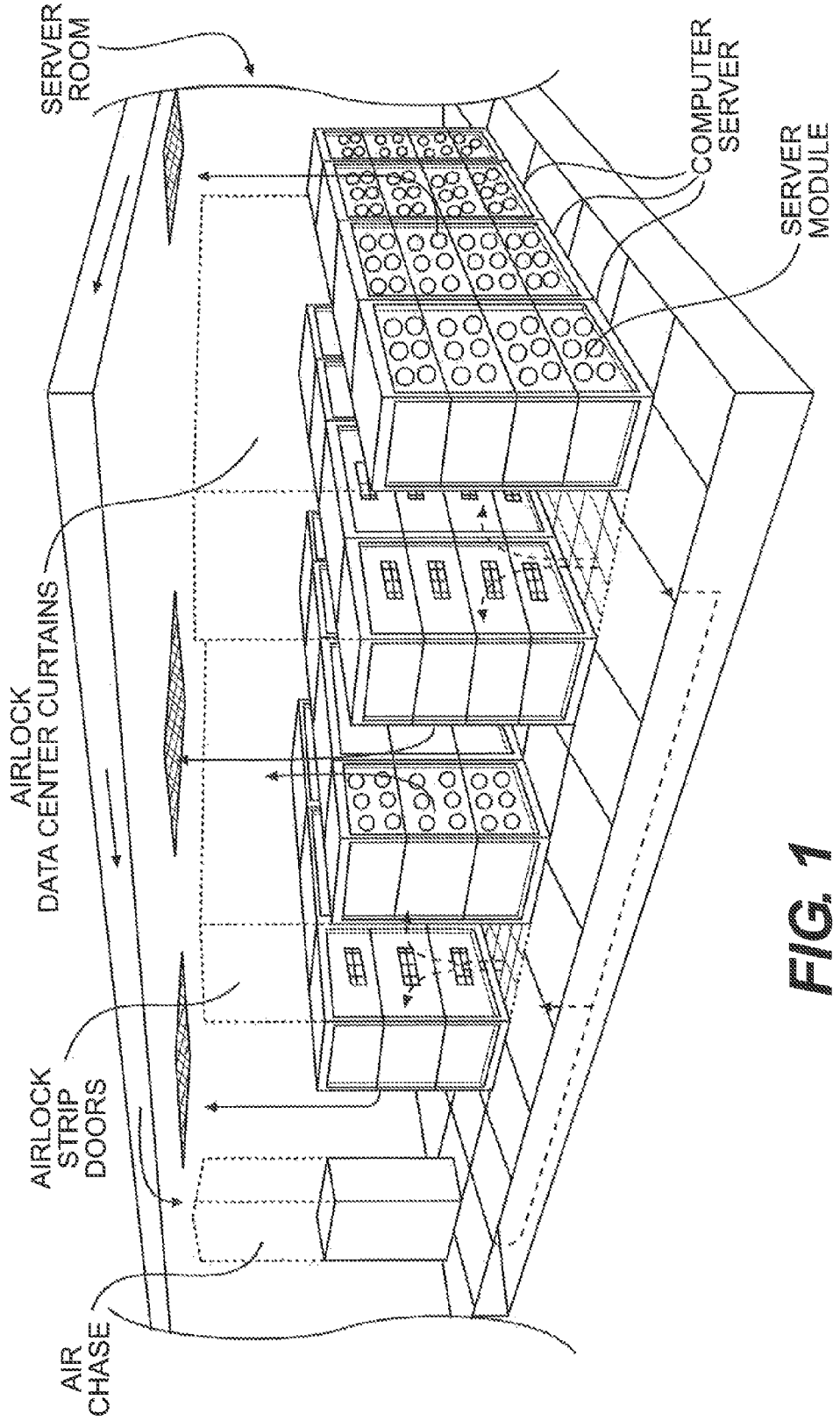
FIG. 1 illustrates a prior art server room cooling system.
Figure 2:
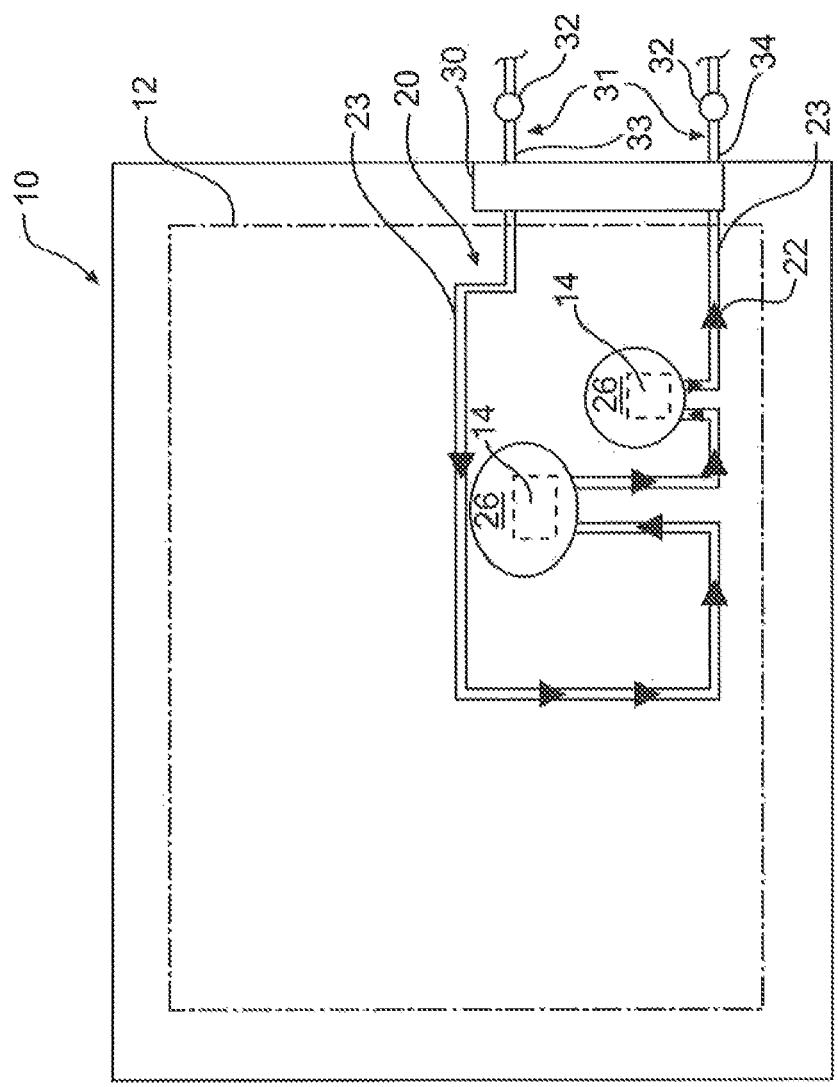
FIG. 2 illustrates a cooling system applied to a server module, according to an exemplary disclosed embodiment.

FIG. 2 illustrates an exemplary individual computer server unit (or a module 10) having a modular chassis adapted for placement in a server rack. Module 10 includes a motherboard 12 having mounted thereon (or attached thereto, such as, for example, by using a data cable) a plurality of heat generating electronic devices 14. These electronic devices 14 may include, without limitation, any type of IC or other devices (such as, for example, CPUs, GPUs, memory, power supplies, disk drives, controllers, etc.) that are found in typical computer systems.

Module 10 may also include a cooling system 20 configured to directly cool one or more electronic devices 14 of the module 10. To directly cool an electronic device 14, a cold plate 26 of the cooling system 10 may be placed in thermal contact (directly in contact, or in contact through a heat transfer medium, such as, for example, thermal grease or a thermal pad) with the electronic device 14. Because of thermal contact, heat may be transferred from the electronic device 14 to the cold plate 26. A coolant 22 of the cooling system 20 may pass through the cold plate 26 to remove heat from, and thereby cool, the electronic device 14. Conduits 23 may deliver the coolant 22 to the cold plates 26 and may couple the coolant 22 to a suitable heat exchanger. In some embodiments, the cooling system 20 may also include pumps or other liquid moving devices (not shown) to assist in transferring the coolant 22 to and from the cold plates 26. Alternatively, some configurations of the cooling system 20 may not include a pump, and instead, rely upon the expansion and contraction of the coolant 22 as it absorbs and dissipates heat to propel the coolant 22 to and from the cold plates 26. Any liquid, such as, for example, glycol, water, alcohol, and mixtures thereof may be used as the coolant 22. It should also be appreciated that the coolant 22 may include a dielectric fluid incapable of conducting electricity. Using the dielectric fluid may therefore prevent damage to the components of module 10, including electronic devices 14, if a leak in the cooling system 20 were to occur in module 10. Non-limiting examples of such dielectric fluids may include deionized water, mineral oils, and mixtures thereof. Such dielectric fluids may also be fluorescent. Although the coolant 22 is described as a liquid, in some embodiments, a phase change material may be used as the coolant 22. In these embodiments, a coolant 22 in a liquid phase may transform to a gaseous phase after absorption of heat at the cold plates 26. The coolant 22 may transform back to the liquid phase after transferring the absorbed heat from the cold plates 26. In some embodiments, valves or other known fluid control devices (not shown) may be provided in the cooling system 20 to control the flow of the coolant 22 therein. Any type of cold plate 26 configured to transfer heat from the electronic device 14 to the coolant 22 circulating within the cooling system 20 may be used as the cold plate 26. The cold plate 26 may include fins, pins, or other such features to assist in transferring the heat from the cold plate 26 to the coolant 22. In some embodiments, devices used to transfer heat from heat generating electronic devices to the coolant in co-assigned U.S. patent application Ser. Nos. 10/578,578, 11/919,974, 12/826,736, 12/914,190, and 12/914,263, with appropriate modifications, may be used as cold plate 26. These patent applications are incorporated by reference herein in their entirety. Although FIG. 2 illustrates two electronic devices 14 as being directly cooled by liquid cooling system 20, this is only exemplary. In general, any number of electronic devices 14 of module 10 may be directly cooled by the cooling system 20 via any number of cold plates 26.

Conduits 23 may exit module 10 via one or more holes defined on the chassis of module 10. In certain embodiments, an empty PCI blind shield 30 may be coupled to the chassis of the module 10 and may direct conduits 23 out of module 10. Terminal ends 31 of conduits 23 may be fluidly coupled to one or more fluid connectors 32. More particularly, an inlet conduit 33 configured to direct coolant 22 into module 10 and an outlet conduit 34 configured to direct coolant 22 out of module 10 may be fluidly coupled to fluid connectors 32. In certain embodiments, coolant 22 may be circulated between module 10 and an appropriate manifold and a secondary cooling system, such as, for example, the manifolds and secondary cooling systems disclosed in co-assigned U.S. patent application Ser. No. 13/304,813, which is incorporated herein by reference in its entirety. It should also be appreciated that one or more other features disclosed in U.S. patent application Ser. No. 13/304,813 may be included in the current disclosure.

Figure 3A:
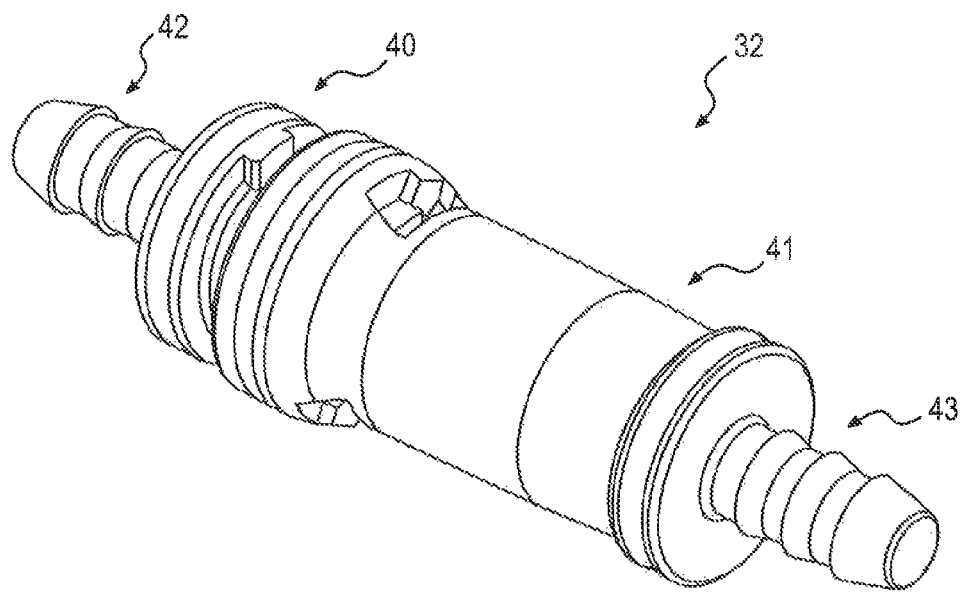
FIG. 3A illustrates a perspective view of a fluid connector for the cooling system of FIG. 2, according to an exemplary disclosed embodiment.
Figure 3B:
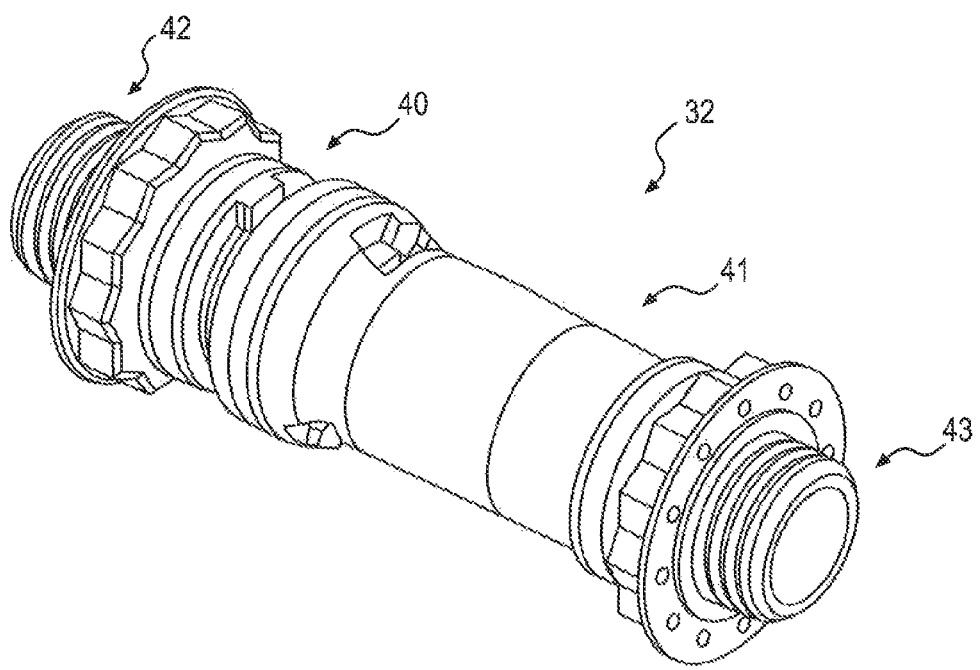
FIG. 3B illustrates a perspective view of another fluid connector for the cooling system of FIG. 2, according to an exemplary disclosed embodiment.

FIGS. 3A and 3B illustrate perspective views of a fluid connector 32, according to an exemplary disclosed embodiment. Fluid connector 32 may be configured to fluidly couple conduits 23 to any other appropriate fluid conduit, and readily connect and disconnect conduits 23 to and from any other appropriate fluid conduit. Fluid connector 32 may include an insert portion 40 and a holding portion 41. Insert portion 40 may be configured to engage with holding portion 41 to form a fluid-tight connection between conduit 23 and another fluid conduit, and may be configured to disengage with holding portion 41 to break the fluid-tight connection. Insert portion 40 may include a connection end 42 and holding portion 41 may include a connection end 43. Connection ends 42, 43 may be configured to connect insert portion 40 and holding portion 41 to suitable fluid conduits in fluid-tight arrangements. In certain embodiments, and as illustrated in FIG. 3A, connection ends 42, 43 may include a barbed surface configured to connect to a fluid conduit via an interference fit arrangement. It should be appreciated, however, that connection ends 42, 43 may include any other suitable configuration to connect insert portion 40 and holding portion 41 to suitable fluid conduits in fluid-tight arrangements. For example, and as shown in FIG. 3B, connection ends 42, 43 may include a threaded arrangement configured to engage corresponding grooves of a fluid conduit.

Figure 4:
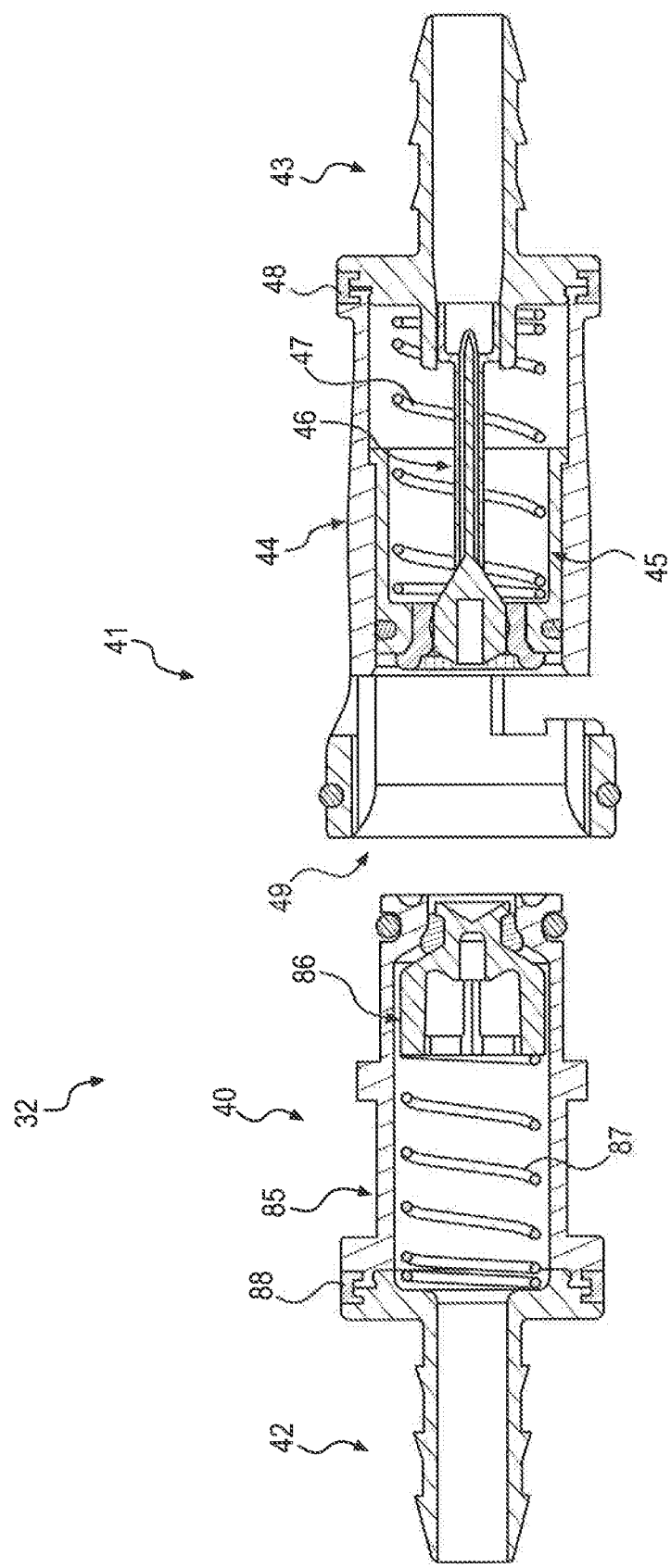
FIG. 4 illustrates a cross-sectional view of the fluid connector of FIG. 3A in a disengaged configuration, according to an exemplary disclosed embodiment.

FIG. 4 illustrates a cross-sectional view of fluid connector 32 in a disengaged configuration, according to an exemplary disclosed embodiment. As shown in FIG. 4, holding portion 41 may include a housing 44, a movable sleeve 45, an adapter 46, and a biasing mechanism 47. Holding portion 41 may also include connection end 43 coupled to housing 44 by a suitable securing mechanism 48, such as, for example, a fastener or a molded joint.

Figures 5, 6:
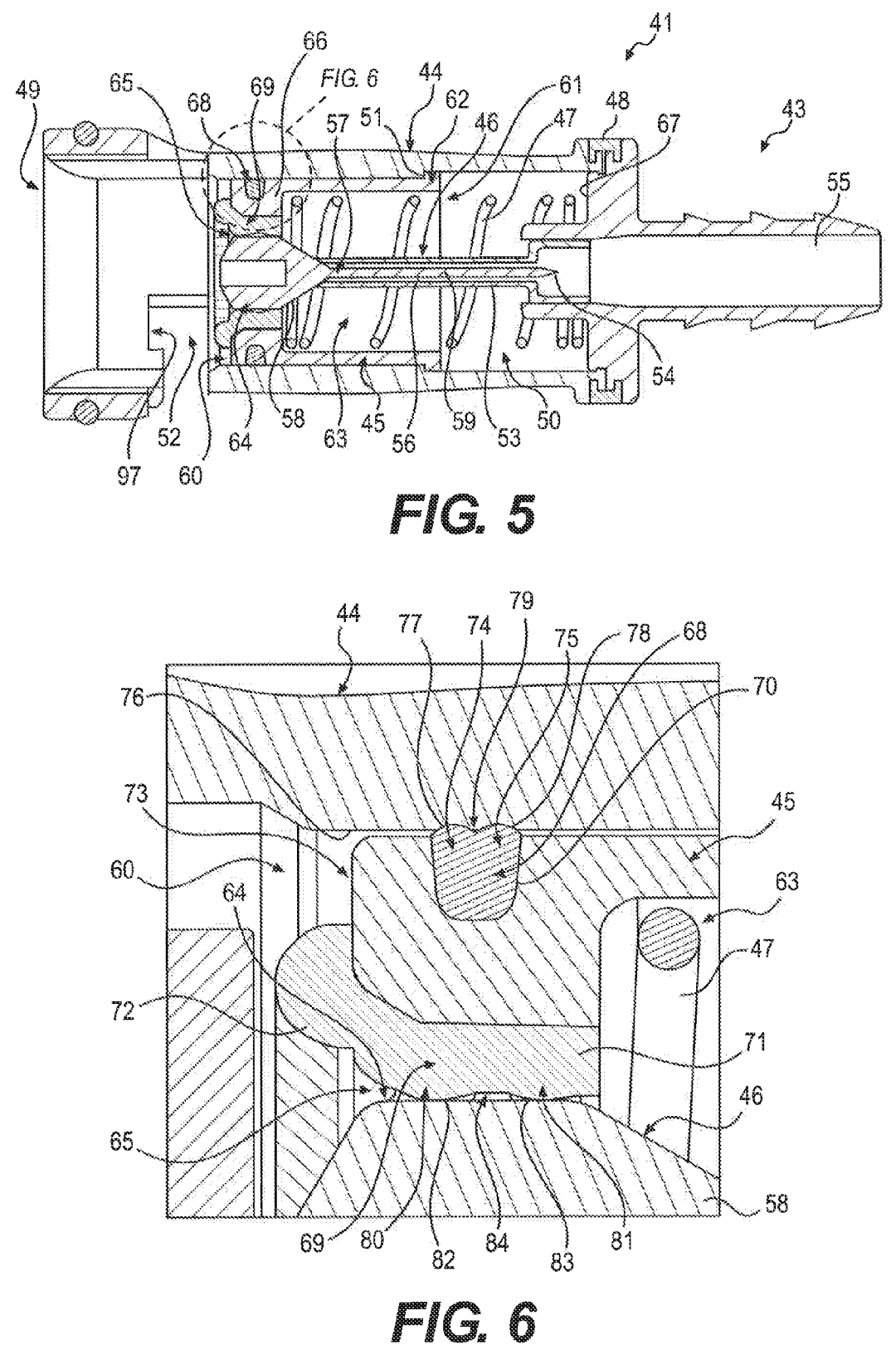

FIG. 5 illustrates a cross-sectional view of holding portion 41, according to an exemplary disclosed embodiment. Housing 44 may include a receiving end 49 opposite connection end 43, and may define a channel 50 configured to direct fluid therethrough. Housing 44 may also include a shoulder 51 positioned within channel 50 and configured to abut against sleeve 45. Locking slots 52 may be defined on an outer surface of housing 44. As will be described in more detail below, locking lugs 95 of insert portion 40 may be configured to engage with locking slots 52 of housing 44.

Adapter 46 may include a tubular structure 53 connected to connection end 43 by any suitable means, such as, for example, adhesives, a weld, a friction fit, and the like. Tubular structure 53 may define a lumen 54 in fluid communication with a flow passage 55 of connection end 43. Tubular structure 53 may also include one or more flow apertures 56 defined on a side surface of tubular structure 53 and in fluid communication with lumen 54. Adapter 46 may also include a valve stem 57. Valve stem 57 may include a head portion 58 and an elongate portion 59. Elongate portion 59 may be inserted into lumen 54 of tubular structure 53, and head portion 58 may be external lumen 54 and connected to tubular structure 53 by any suitable means, such as, for example, adhesives, a weld, a friction fit, and the like.

Sleeve 45 may be disposed in and configured to move relative to channel 50. Sleeve 45 may include a first end 60 and a second end 61. An outer sleeve shoulder 62 may be defined at second end 61, and may be configured to abut against shoulder 51 of housing 44 and may restrict axial movement of sleeve 45 towards receiving end 49 of housing 44. Sleeve 45 may also include a first flow passage 63 and a second flow passage 64 having an opening 65 defined at first end 60. First flow passage 63 and second flow passage 64 may be in fluid communication with flow apertures 56 of adapter 46. Second flow passage 64 may include a diameter smaller than a diameter of first flow passage 63. Second flow passage 64 may also include an inner sleeve shoulder 66 configured to engage biasing mechanism 47 and defined at an interface between first flow passage 63 and second flow passage 64.

Biasing mechanism 47 may be positioned between inner sleeve shoulder 66 of sleeve 45 and a biasing surface 67 of connection end 43. Biasing mechanism 47 may extend through first flow passage 63 of sleeve 45 and channel 50 of housing 44. Ends of biasing mechanism 47 may be connected to inner sleeve shoulder 66 and biasing surface 67 by any suitable means, such as, for example, adhesives, a weld, and the like, and biasing mechanism 47 may encase adapter 46. Biasing mechanism 47 may include any suitable structure, such as, for example, a spring, configured to bias sleeve 45 in an axial direction towards receiving end 49 of housing 44. Axial force overcoming the biasing force of biasing mechanism 47 may be exerted on sleeve 45 to collapse biasing mechanism 47 and axially move sleeve 45 towards connection end 43.

A first seal 68 and a second seal 69 may be associated with sleeve 45. First and second seals 68, 69 may be configured to provide a fluid-tight seal between sleeve 45 and housing 44, between housing 44 and adapter 46, and between sleeve 45 and certain components of insert portion 40. First and second seals 68, 69 may include any suitable structure configured to provide a fluid-tight sealing arrangement. For example, first and second seals 68, 69 may include molded seals formed by any suitable molding process, such as the molding process disclosed in U.S. Pat. No. 7,407,165, which is incorporated herein by reference in its entirety. In certain other embodiments, however, first and second seals 68, 69 may include mechanical gaskets formed of any suitable sealing material, such as, for example, rubber or silicone.

FIG. 6 illustrates an enlarged view of a portion of holding portion 41 shown in FIG. 5. First and second seals 68, 69 may be distinct and separate structures. That is, first seal 68 may be secured within a recess 70 defined around an outer surface of sleeve 45 proximate first end 60, while second seal 69 may be secured to an inner surface of sleeve 45 defining second flow passage 64. More particularly, second seal 69 may include a first portion 71 and a second portion 72. First portion 71 may extend from the interface between first flow passage 63 and second flow passage 64, through second flow passage 64, and to opening 65. Second portion 72 may extend out of opening 65 and may curl towards the side surfaces (i.e., the surfaces perpendicular to opening 65) of sleeve 45. In other words, second portion 72 may extend out of opening 65 and may cover a portion of a terminal face 73 of sleeve 45. Accordingly, second seal 69 may include a substantially funnel-shaped configuration.

As alluded to above, first seal 68 may be configured to form a seal between sleeve 45 and housing 44, and second seal 69 may be configured to form a seal between sleeve 45 and adapter 46. More specifically, first seal 68 may include a first ridge 74 and a second ridge 75 configured to engage an inner surface 76 of housing 44 defining channel 50 to form a first fluid-tight interface 77 and a second fluid-tight interface 78. A valley 79 may separate first ridge 74 and second ridge 75, and accordingly, first ridge 74 and second ridge 75 may provide two distinct contact surfaces to form first fluid-tight interface 77 and second fluid-tight interface 78, respectively. By forming multiple fluid-tight interfaces 77, 78, first and second ridges 74, 75 may provide a stronger and more resilient seal between first seal 68 and housing 44. Although illustrated as having two ridges 74, 75, it should be appreciated that first seal 68 may include more than two ridges to form more than two fluid-tight sealing interfaces with housing 44.

Similarly, first portion 71 of second seal 69 may include a first ridge 80 and a second ridge 81 configured to engage head portion 58 to form a first fluid-tight interface 82 and a second fluid-tight interface 83. A valley 84 may separate first ridge 80 and second ridge 81, and accordingly, first ridge 80 and second ridge 81 may provide two distinct contact surfaces to form first fluid-tight interface 82 and second fluid-tight interface 83, respectively. By forming multiple fluid-tight interfaces 82, 83, first and second ridges 80, 81 may provide a stronger and more resilient seal between second seal 69 and adapter 46. Although illustrated as having two ridges 80, 81, it should be appreciated that first portion 71 of second seal 69 may include more than two ridges to form more than two fluid-tight sealing interfaces with adapter 46.

Referring back to FIG. 4, insert portion 40 may include a housing 85, an insert valve 86, and a biasing mechanism 87. Insert portion 40 may also include connection end 42 coupled to housing 85 by a suitable securing mechanism 88, such as, for example, a fastener or a molded joint.

Figure 7:
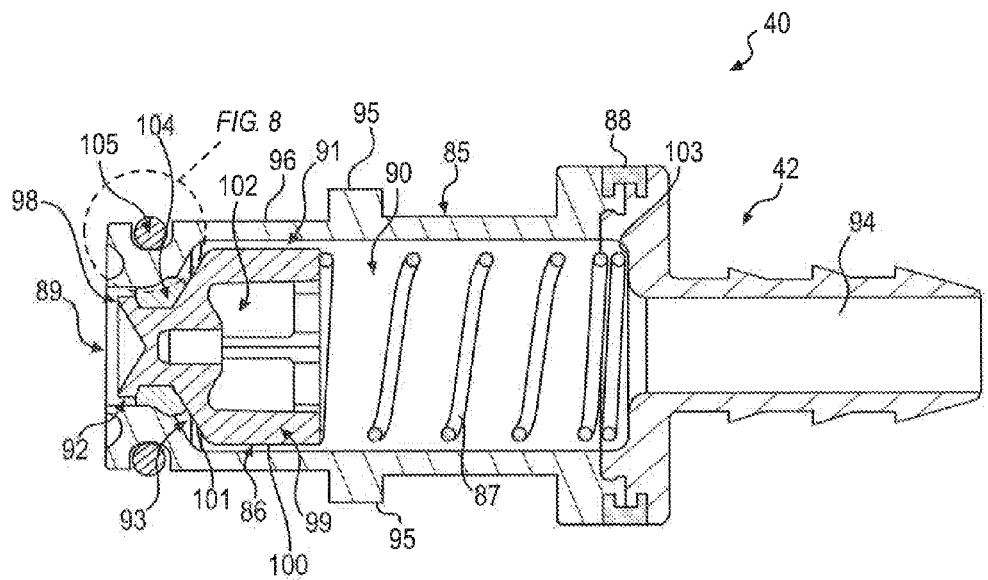
FIG. 7 illustrates a cross-sectional view of an insert portion of the fluid connector of FIG. 3A, according to an exemplary disclosed embodiment.

FIG. 7 illustrates a cross-sectional view of insert portion 40, according to an exemplary disclosed embodiment. Housing 85 may include an open end 89 opposite connection end 42, and may define a channel 90 configured to direct fluid therethrough. Channel 90 may include a first passage 91, a second passage 92, and a tapered passage 93. Second passage 92 may include a diameter smaller than a diameter of first passage 91. Tapered passage 93 may extend between first passage 91 and second passage 92 and may include a tapering diameter from first passage 91 to second passage 92. Moreover, channel 90 may be in fluid communication with a flow passage 94 of connection end 42.

As alluded to above, locking lugs 95 may be positioned around an outer surface 96 of housing 85. When insert portion 40 is inserted into channel 50 of housing 44 of holding portion 41 (FIG. 9), locking lugs 95 may positioned within locking slots 52 of housing 44. Insert portion 40 may then be rotated (i.e., twisted) relative to housing 44 such that locking lugs 95 may be advanced towards locking seats 97 of locking slots 52. Locking seats 97 may abut against locking lugs 95 and may therefore hold together insert portion 40 and holding, portion 41.

Insert valve 86 may include a valve head 98 and a valve body 99, and may be disposed in and configured to move relative to channel 90. Valve body 99 may include a first portion 100 having a diameter larger than a diameter of valve head 98 and a tapered portion 101 positioned between valve head 98 and first portion 100. Tapered portion 101 may include a tapering diameter from first portion 100 to valve head 98. Insert valve 86 may also include one or more flow apertures 102 defined on a side surface of valve body 99 and in fluid communication with channel 90 of housing 85.

Biasing mechanism 87 may be positioned between insert valve 86 and a biasing surface 103 of connection end 42. Biasing mechanism 87 may extend through first passage 91 of housing 85. Ends of biasing mechanism 87 may be connected to valve body 99 and biasing surface 103 of connection end 42 by any suitable means, such as, for example, adhesives, a weld, and the like. Biasing mechanism 87 may include any suitable structure, such as, for example, a spring, configured to bias insert valve 86 in an axial direction towards open end 89 of housing 85. As shown in FIGS. 4 and 7, in the biased configuration, biasing mechanism 87 may position valve head 98 of insert valve 86 within second passage 92 of channel 90. Axial force overcoming the biasing force of biasing mechanism 87 may be exerted on insert valve 86 to collapse biasing mechanism 87 and axially move insert valve 86 towards connection end 42.

A third seal 104 and a fourth seal 105 may also be associated with insert portion 40. Third seal 104 may be configured to provide a fluid-tight seal between insert valve 86 and housing 85. As will be discussed in more detail below, fourth seal 105 may be configured to provide a fluid-tight seal between housing 85 of insert portion 40 and housing 44 of holding portion 41. Third and fourth seals 104, 105 may include any suitable structure configured to provide a fluid-tight sealing arrangement. For example, third and fourth seals 104, 105 may include molded seals or mechanical gaskets formed of any suitable sealing material, such as, for example, rubber or silicone.

Figure 8:
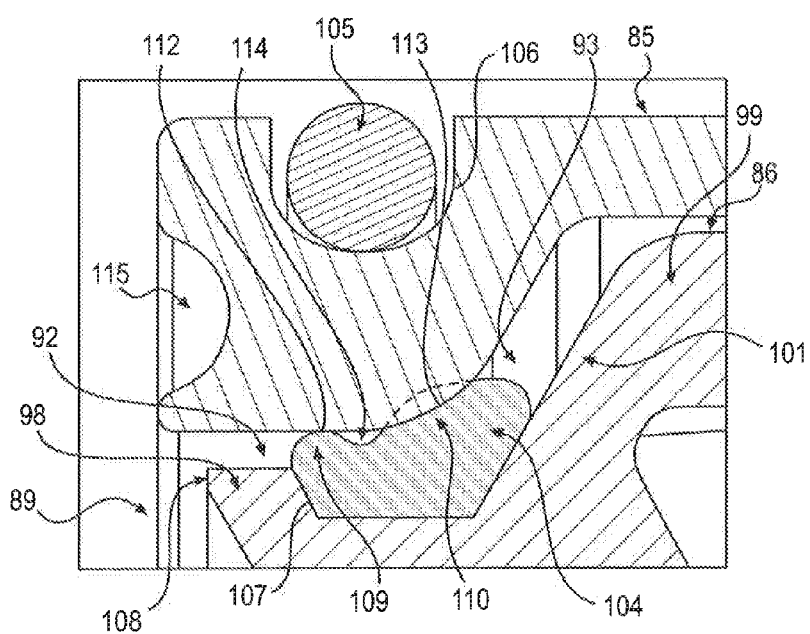
FIG. 8 illustrates an enlarged cross-sectional view of the insert portion of FIG. 7, according to an exemplary disclosed embodiment.

FIG. 8 illustrates an enlarged view of a portion of insert portion 40 shown in FIG. 7. Third and fourth seals 104, 105 may also be distinct and separate structures. That is, fourth seal 105 may be secured within a recess 106 defined around an outer surface of housing 85 proximate open end 89, while third seal 104 may be secured to an outer surface of insert valve 86. More particularly, third seal 104 may be secured to valve head 98 and valve body 99, and may extend from a shoulder 107 defined on an insert end 108 of valve head 98 to tapered portion 101 of valve body 99.

As alluded to above, third seal 104 may be configured to form a seal between insert valve 86 and housing 85. More specifically, third seal 104 may include a first ridge 109 and a second ridge 110. First ridge 109 may contact a first portion of second passage 92 to form a first fluid-tight interface 112, and second ridge 110 may contact a second portion of second passage 92 and a portion of tapered passage 93 to form a second fluid-tight interface 113. A valley 114 may separate first ridge 109 and second ridge 110, and accordingly, first ridge 109 and second ridge 110 may provide two distinct contact surfaces to form first fluid-tight interface 112 and second fluid-tight interface 113, respectively. It should also be appreciated that second ridge 110 may include a larger contact surface area than a contact surface area of first ridge 109. By forming multiple fluid-tight interfaces 112, 113, first and second ridges 109, 110 may provide a stronger and more resilient seal between third seal 104 and housing 85. Although illustrated as having two ridges 109, 110, it should be appreciated that third seal 104 may include more than two ridges to form more than two fluid-tight sealing interfaces with housing 85.

Figure 9:
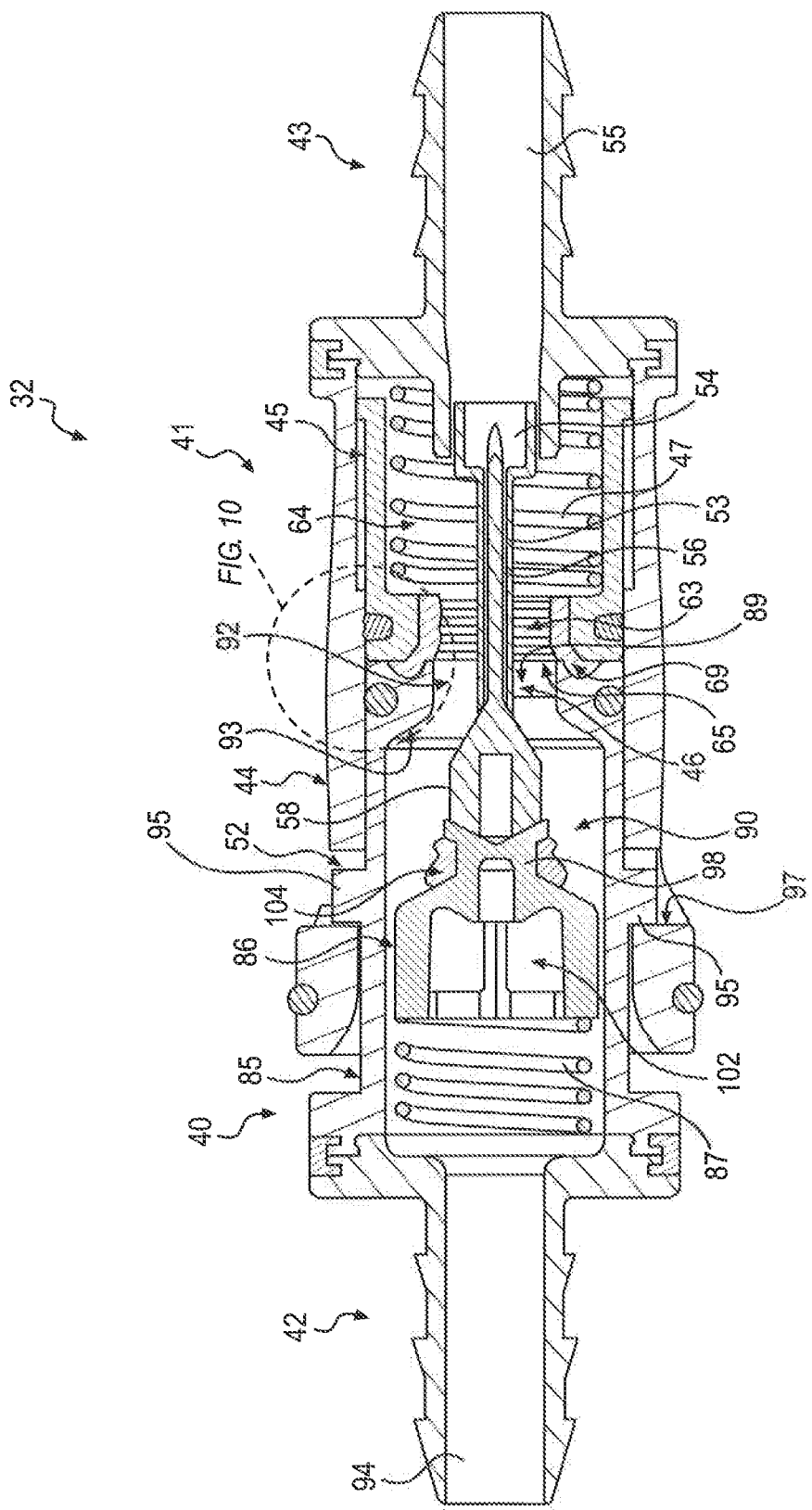
FIG. 9 illustrates a cross-sectional view of the fluid connector of FIG. 3A in an engaged configuration, according to an exemplary disclosed embodiment.

FIG. 9 illustrates a cross-sectional view of fluid connector 32 in an engaged configuration, according to an exemplary disclosed embodiment. In the engaged configuration, housing 85 of insert portion 40 may be introduced into housing 44 of holding portion 41. Moreover, housing 85 may be pushed against sleeve 45, overcome the biasing force of biasing mechanism 47, and axially advance sleeve 45 towards connection end 43. By axially advancing sleeve 45, the seal formed between second seal 69 and adapter 46 may be broken. First ridge 74 and second ridge 75 of second seal 69 may disengage from head portion 58. Accordingly, fluid communication may be provided through holding portion 41. More specifically, fluid may flow through opening 65 of sleeve 45, first and second flow passages 63, 64, flow apertures 56 of tubular structure 53, lumen 54 of tubular structure 53, and flow passage 55 of connection end 43, and vice versa. Additionally, in the engaged configuration, head portion 58 of valve stem 57 may be pushed against valve head 98, overcome the biasing force of biasing mechanism 87, and axially advance insert valve 86 towards connection end 42. By axially advancing insert valve 86, the seal formed between third seal 104 and housing 85 may be broken. First ridge 109 and second ridge 110 of third seal 104 may disengage from second passage 92 and tapered passage 93 of channel 90. As such, fluid communication may be provided through insert portion 40. Particularly, fluid may flow through flow passage 94 of connection end 42, flow apertures 102 of insert valve 86, channel 90 of housing 85, and open end 89 of housing 85, and vice versa. The engaged configuration may therefore provide a fluid-tight channel between flow passage 94 of connection end 42 and flow passage 55 of connection end 43.

Furthermore, insert portion 40 may be rotated relative to housing 44 such that locking lugs 95 may be advanced towards locking seats 97 of locking slots 52. Fluid connector 32 may be held in the engaged configuration since locking seats 97 may abut against locking lugs 95 to secure together insert portion 40 and holding portion 41.

Figure 10:
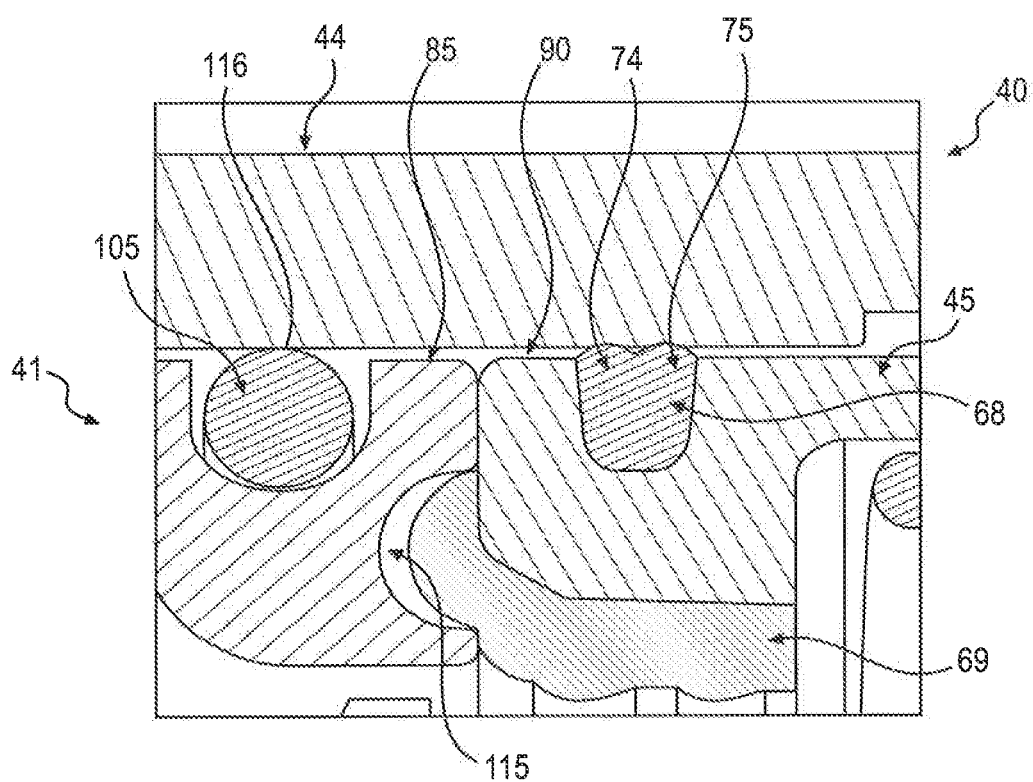
FIG. 10 illustrates an enlarged cross-sectional view of the fluid connector of FIG. 9, according to an exemplary disclosed embodiment.

FIG. 10 illustrates an enlarged view of a portion of fluid connector 32 shown in FIG. 9. As alluded to above, fourth seal 105 may be configured to form a seal between housing 85 of insert portion 40 and housing 44 of holding portion 41. More specifically, and with reference to FIGS. 9 and 10, fourth seal 105 may be configured to engage an inner surface of channel 90 to form a third fluid-tight interface 116. It should also be appreciated that fourth seal 105 may include a plurality of ridges similar to first and second ridges 74, 75 of first seal 68 discussed above. Fourth seal 105 may form an additional seal to prevent fluid leakage through housing 44 of holding portion 41 and out of receiving end 49, and therefore, provide an improved fluid-tight connection between insert portion 40 and holding portion 41. In addition, the contact points between a recessed face 115 of housing 85 and second seal 69 of sleeve 45 may form fluid-tight interfaces to prevent fluid leakage between housing 85 of insert portion 40 and sleeve 45.

Figure 11A:
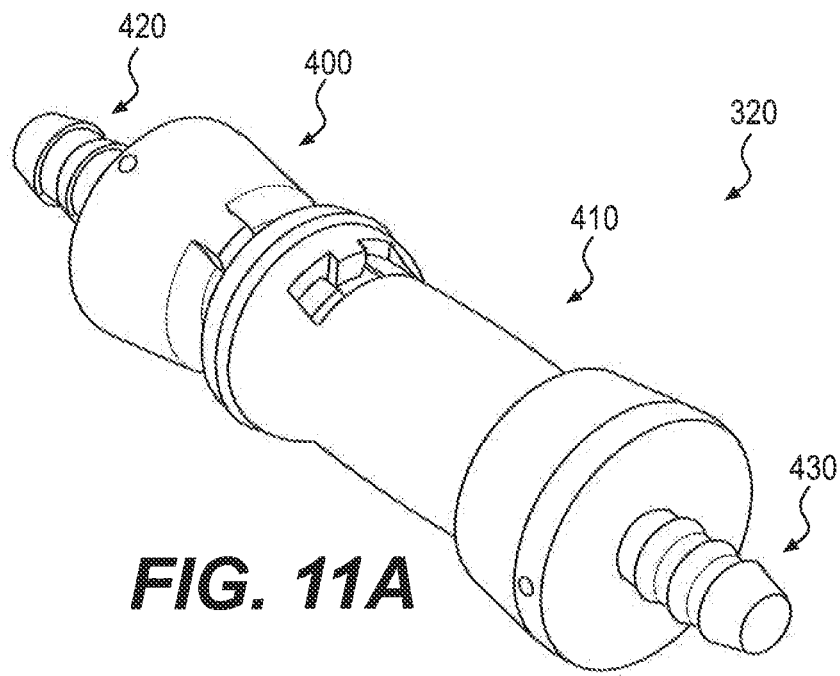
FIG. 11A illustrates a perspective view of another fluid connector for the cooling system of FIG. 2, according to an exemplary disclosed embodiment.
Figure 11B:
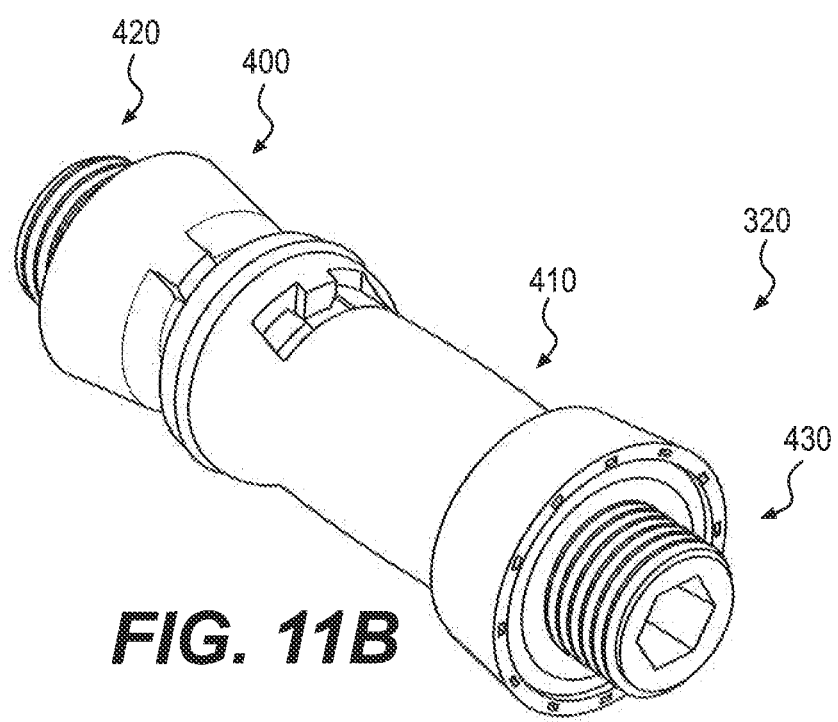
FIG. 11B illustrates a perspective view of another fluid connector for the cooling system of FIG. 2, according to an exemplary disclosed embodiment.

FIGS. 11A and 11B illustrate perspective views of another fluid connector 320, according to an exemplary disclosed embodiment. Similar to fluid connector 32, fluid connector 320 may be configured to fluidly couple conduits 23 to any other appropriate fluid conduit, and readily connect and disconnect conduits 23 to and from any other appropriate fluid conduit. Fluid connector 320 may include an insert portion 400 and a holding portion 410. Insert portion 400 may be configured to engage with holding portion 410 to form a fluid-tight connection between conduit 23 and another fluid conduit, and may be configured to disengage with holding portion 410 to break the fluid-tight connection. Insert portion 400 may include a connection end 420 and holding portion 410 may include a connection end 430. Connection ends 420, 430 may be configured to connect insert portion 400 and holding portion 410 to suitable fluid conduits in fluid-tight arrangements. In certain embodiments, and as illustrated in FIG. 11A, connection ends 420, 430 may include a barbed surface configured to connect to a fluid conduit via an interference fit arrangement. It should be appreciated, however, that connection ends 420, 430 may include any other suitable configuration to connect insert portion 400 and holding portion 410 to suitable fluid conduits in fluid-tight arrangements. For example, and as shown in FIG. 11B, connection ends 420, 430 may include a threaded arrangement configured to engage corresponding grooves of a fluid conduit.

FIG. 12 illustrates a cross-sectional view of fluid connector 320 in a disengaged configuration, according to an exemplary disclosed embodiment. FIG. 13 illustrates a cross-sectional view of fluid connector 320 in an engaged configuration, according to an exemplary disclosed embodiment. As shown in FIGS. 12 and 13, fluid connector 320 may be substantially similar to fluid connector 32. However, insert portion 400 of fluid connector 320 may include connection end 420 coupled to a housing 850 by a first threaded arrangement, and holding portion 410 of fluid connector 320 may include connection end 430 coupled to a housing 440 by a second threaded arrangement.

Housing 850 of insert portion 400 may include a grooved portion 860, and connection end 420 may include a threaded portion 460 configured to engage with grooved portion 860. A first connecting seal 900 may be positioned between grooved portion 860 and threaded portion 460, and may be configured to provide a fluid-tight interface between housing 850 and connection end 420. An outer surface 870 of housing 850 surrounding grooved portion 860 may include a tapered outer diameter. It should be appreciated, however, that in other embodiments, outer surface 870 may include a substantially constant outer diameter. A flow passage 940 of connection end 420 may include a first portion 950 and a second portion 960. Second portion 960 may be defined proximate threaded portion 460, and may include an inner diameter larger than an inner diameter of first portion 950. It should be appreciated, however, that in certain other embodiments, first portion 950 and second portion 960 may include substantially equal inner diameters.

Housing 440 of holding portion 410 may include a grooved portion 560, and connection end 430 may include a threaded portion 660 configured to engage with grooved portion 560. A second connecting seal 910 may be positioned between grooved portion 560 and threaded portion 660, and may be configured to provide a fluid-tight interface between housing 440 and connection end 430. An outer surface 670 of housing 440 surrounding grooved portion 560 may include a tapered outer diameter; however, it should be appreciated that in other embodiments, outer surface 670 may include a substantially constant outer diameter. A flow passage 550 of connection end 430 may include a first portion 750 and a second portion 760. Second portion 760 may be defined proximate threaded portion 660, and may include an inner diameter larger than an inner diameter of first portion 750. It should be appreciated, however, that in certain other embodiments, first portion 750 and second portion 760 may include substantially equal inner diameters. Tubular structure 53 of adapter 46 may be disposed in second portion 760.

Figure 14:
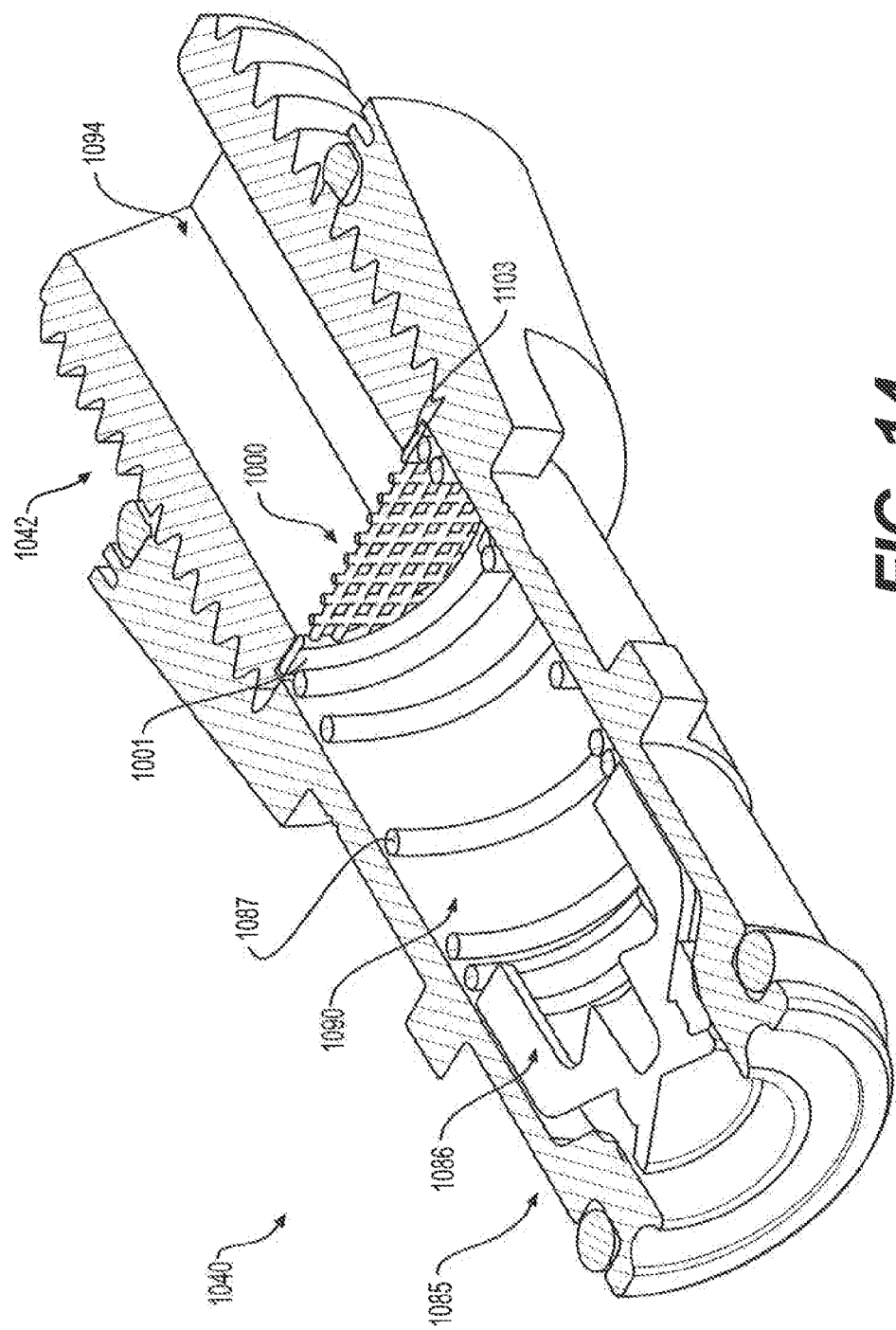
FIG. 14 illustrates a cross-sectional view of an insert portion of another fluid connector, according to an exemplary disclosed embodiment.
Figure 15:
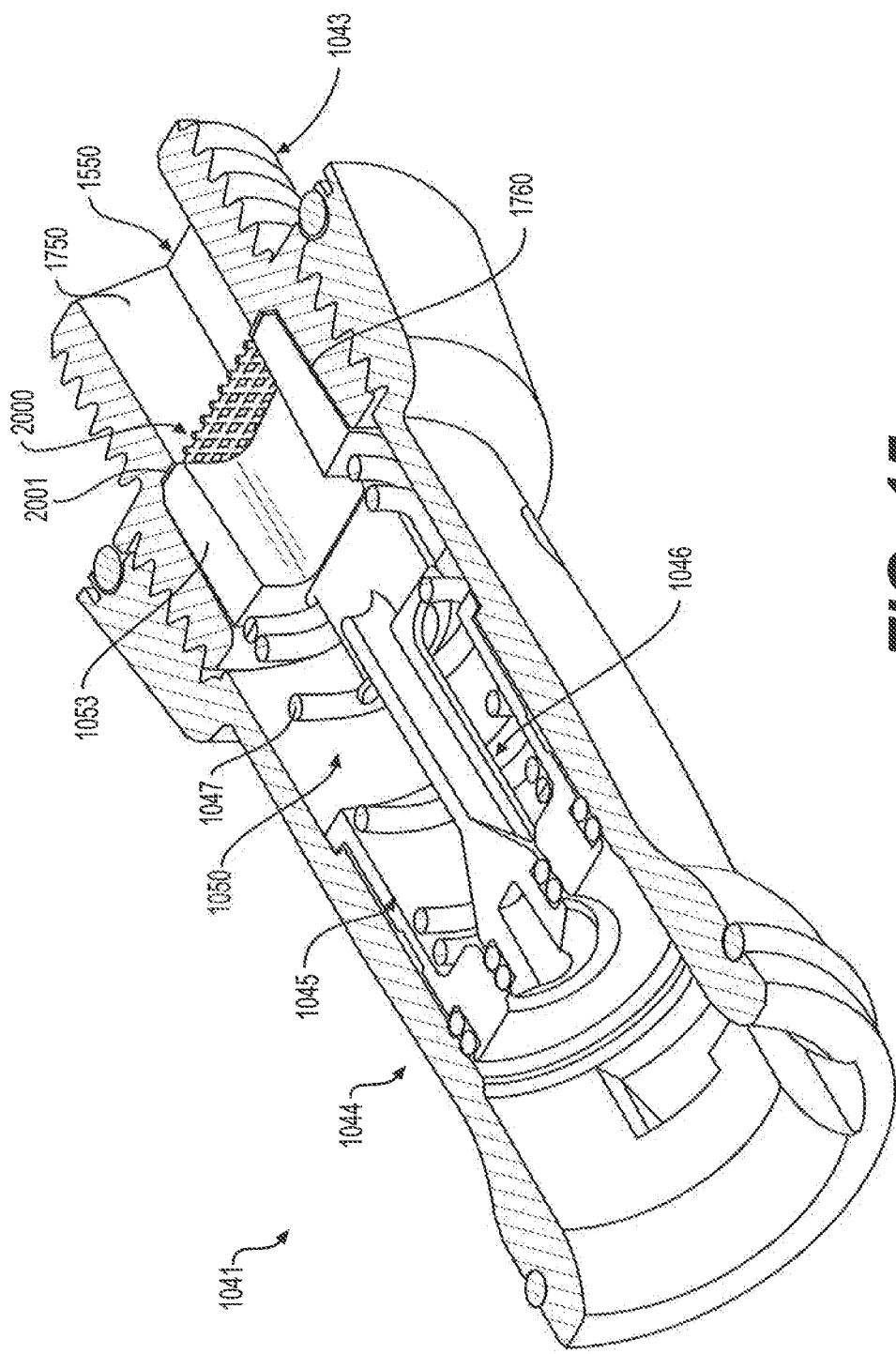
FIG. 15 illustrates a cross-sectional view of a holding portion of another fluid connector, according to an exemplary disclosed embodiment.

In certain embodiments, the fluid connectors of the present disclosure may include one or more filters to prevent the flow and build-up of contaminants suspended in coolant 22, such as dirt and debris, in the fluid connectors. As illustrated in FIGS. 14 and 15, such filters may be disposed in one or both of the insert portion and the holding portion of the fluid connector.

FIG. 14 illustrates a cross-sectional view of an insert portion 1040 of another fluid connector, according to an exemplary disclosed embodiment. Insert portion 1040 may include similar features as insert portion 40 and insert portion 400 discussed above. For example, insert portion 1040 may include a housing 1085 defining a channel 1090, an insert valve 1086, and a biasing member 1087. Insert portion 1040 may also include a connection end 1042 defining a flow passage 1094 and coupled to housing 1085 by a suitable securing mechanism, such as, for example, a threaded arrangement. In addition, insert portion 1040 may include a first filter 1000 positioned between biasing mechanism 1087 and connection end 1042.

First filter 1000 may be positioned between biasing mechanism 1087 and connection end 1042 to capture any contaminants in coolant 22 as coolant 22 flows from flow passage 1094 of connection end 1042 into housing 1085. Particularly, first filter 1000 may be configured to block the entry of contaminants into channel 1090 of housing 1085. As such, first filter 1000 may protect certain components of insert portion 1040 from the presence or build-up of contaminants in channel 1090 of housing 1085. For example, first filter 1000 may prevent damage to and/or interference with insert valve 1086 and biasing mechanism 1087 caused by contaminants, which in turn may help maintain the performance of insert portion 1040 and the fluid connector.

To that end, first filter 1000 may include any suitable filtration device through which liquid or gas may pass to block and/or remove suspended contaminants. For example, first filter 1000 may include a porous surface having a plurality of pores appropriately sized to allow the flow of liquid or gas but block contaminants therethough. In some embodiments, first filter 1000 may include a porous structure formed of woven stainless steel filaments. In other embodiments, first filter 1000 may include a porous structure formed of an injection molded rubber or plastic. First filter 1000 may also include an outer rim 1001 onto which biasing member 1087 and a shoulder 1103 of connection end 1042 may abut. Outer rim 1001 may be a non-porous surface (i.e., a solid surface without any pores) to support the force applied onto first filter 1000 as biasing member 1087 is compressed. Moreover, first filter 1000 may include a substantially circular shape. It should also be appreciated, however, that first filter 1000 may include any other suitable shape depending on, for example, outer shape of connection end 1042. In certain embodiments, first filter 1000 may be removed to be replaced and/or serviced by disengaging connection end 1042 from housing 1085.

FIG. 15 illustrates a cross-sectional view of a holding portion 1041 of another fluid connector, according to an exemplary disclosed embodiment. Holding portion 1041 may include similar features as holding portion 41 and holding portion 410 discussed above. For example, holding portion 1041 may include a housing 1044 defining a channel 1050, a movable sleeve 1045, an adapter 1046 having a tubular structure 1053, and a biasing member 1047. Holding portion 1041 may also include a connection end 1043 defining a flow passage 1550 having a first portion 1750 and a second portion 1760, wherein the flow passage 1550 passes through the tubular structure 1053. The tubular structure 1053 positioned within the first portion, and the biasing member 1047 abutting an end of tubular structure 1053. Connection end 1043 may be coupled to housing 1044 by a suitable securing mechanism, such as, for example, a threaded arrangement. Similar to insert potion 1040, holding portion 1041 may also include a second filter 2000 positioned between tubular structure 1053 and connection end 1043.

Second filter 2000 may be positioned between tubular structure 1053 and connection end 1043 to capture any contaminants in coolant 22 as coolant 22 flows from flow passage 1550 of connection end 1043 into housing 1044. Particularly, second filter 2000 may be configured to block the entry of contaminants into channel 1050 of housing 1044. As such, second filter 2000 may protect certain components of holding portion 1041 from the presence or build-up of contaminants in channel 1050 of housing 1044. For example, second filter 2000 may prevent damage to and/or interference with movable sleeve 1045, adapter 1046, and biasing mechanism 1047 caused by contaminants, which in turn may help maintain the performance of holding portion 1041 and the fluid connector.

Like first filter 1000, second filter 2000 may include any suitable filtration device through which liquid or gas is passed to block and/or remove suspended contaminants. In some embodiments, second filter 2000 may include a porous structure formed of woven stainless steel filaments. In other embodiments, second filter 2000 may include a porous structure formed of an injection molded rubber or plastic. Second filter 2000 may also include an outer rim 2001 onto which tubular structure 1053 and a shoulder between first portion 1750 and second portion 1760 of flow passage 1550 may abut. Outer rim 2001 may be a non-porous surface (i.e., a solid surface without any pores) to support the force applied onto second filter 2000. Moreover, second filter 2000 may include a substantially circular shape. It should also be appreciated, however, that second filter 2000 may include any other suitable shape depending on, for example, outer shape of connection end 1043. In certain embodiments, second filter 2000 may be removed to be replaced and/or serviced by disengaging connection end 1043 from housing 1044.

It will be apparent to those skilled in the art that various modifications and variations can be made to the disclosed cooling systems. Other embodiments will be apparent to those skilled in the art from consideration of the specification and practice of the disclosed cooling systems. It is intended that the specification and examples be considered as exemplary only, with a true scope being indicated by the following claims and their equivalents.

What is claimed is:
1. A fluid connector, comprising:
   an insert portion including:
   a first housing defining a first channel;
   an insert valve disposed in and configured to move relative to the first channel; and
   a first filter configured to prevent a flow of contaminants into the first channel of the first housing, wherein the first filter includes a porous surface and an outer rim formed of a non-porous surface;
   a first connection end coupled to the first housing and defining a first connection passage, wherein the first filter is positioned between the first channel and the first connection passage;
   a biasing mechanism engaged with the insert valve, wherein the first filter is positioned between the biasing mechanism and a shoulder of the first connection end and the outer rim of the first filter abuts against the shoulder of the first connection end and the biasing mechanism; and
   a holding portion including;
   a second housing defining a second channel:
   a sleeve disposed in the second channel and defining a passage;
   a second connection end defining a second connection passage, wherein the second connection passage includes a first portion and a second portion;
   an adapter disposed in the passage of the sleeve, wherein the adapter includes a tubular structure positioned within the first portion, wherein the tubular structure has a through bore, and wherein a second biasing mechanism abuts the tubular structure positioned in the first portion; and
   a second filter configured to prevent the flow of contaminants into the second channel of the second housing;

wherein the insert portion is configured to be inserted into the second channel between the second channel and the second connection passage and secured to the holding portion; and wherein the second filter is positioned between the tubular structure and a shoulder of the second connection passage defined between the first portion and the second portion of the second connection passage.

2. The fluid connector of claim 1, wherein the porous surface of the filter includes stainless steel filaments woven together.

3. The fluid connector of claim 1, wherein the filter is formed of an injection molded rubber.

4. A fluid connector, comprising:
an insert portion including:
    a first housing defining a first channel;
    an insert valve disposed in and configured to move relative to the first channel;
    a first filter configured to prevent a flow of contaminants into the first channel of the first housing, wherein the first filter includes a porous surface and an outer rim formed of a non-porous surface;
    a first connection end coupled to the first housing and defining a first connection passage, wherein the first filter is positioned between the first channel and the first connection passage;
    a biasing mechanism engaged with the insert valve, wherein the first filter is positioned between the biasing mechanism and a shoulder of the first connection end and the outer rim of the first filter abuts against the shoulder of the first connection end and the biasing mechanism;
a holding portion including:
    a second housing defining a second channel;
    a sleeve disposed in the second channel and defining a passage;
    a second connection end defining a second connection passage, wherein the second connection passage includes a first portion and a second portion;
    an adapter disposed in the passage of the sleeve, wherein the adapter includes a tubular structure positioned within the first portion, wherein the tubular structure has a through bore, and wherein a second biasing mechanism abuts the tubular structure positioned in the first portion; and
    the second filter configured to prevent the flow of contaminants into the second channel of the second housing;
wherein the insert portion is configured to be inserted into the second channel between the second channel and the second connection passage and secured to the holding portion; and
wherein the second filter is positioned between the tubular structure and a shoulder of the second connection passage defined between the first portion and the second portion of the second connection passage.

5. The fluid connector of claim 4, wherein the holding portion further comprises the second biasing mechanism encasing the adapter and engaged with the sleeve, wherein the second biasing mechanism is configured to bias the sleeve towards an opening of the second housing.

6. The fluid connector of claim 4, wherein the second filter is positioned between the adapter and the second connection end.

7. The fluid connector of claim 4, wherein an outer rim of the second filter abuts against the shoulder of the second connection passage and the tubular structure of the adapter.

8. The fluid connector of claim 4, wherein at least one of the first filter and the second filter includes stainless steel filaments woven together.

9. The fluid connector of claim 4, wherein at least one of the first filter and the second filter is formed of an injection molded rubber.

* * * * *

UNITED STATES PATENT AND TRADEMARK OFFICE
CERTIFICATE OF CORRECTION

| | | |
|---|---|---|
| PATENT NO. | : 9,016,314 B2 | Page 1 of 1 |
| APPLICATION NO. | : 13/832593 | |
| DATED | : April 28, 2015 | |
| INVENTOR(S) | : André Sloth Eriksen et al. | |

It is certified that error appears in the above-identified patent and that said Letters Patent is hereby corrected as shown below:

Claims

In claim 4, column 14, line 10, "the second filter" should read --a second filter--.

Signed and Sealed this
Twenty-third Day of February, 2016

Michelle K. Lee
*Director of the United States Patent and Trademark Office*